(12) United States Patent
Lee

(10) Patent No.: US 7,605,400 B2
(45) Date of Patent: Oct. 20, 2009

(54) METHOD FOR FABRICATING LIQUID CRYSTAL DISPLAY DEVICE

(75) Inventor: Seok Woo Lee, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/320,896

(22) Filed: Feb. 6, 2009

(65) Prior Publication Data

US 2009/0153763 A1   Jun. 18, 2009

Related U.S. Application Data

(62) Division of application No. 11/361,990, filed on Feb. 27, 2006, now Pat. No. 7,501,654.

(30) Foreign Application Priority Data

Feb. 28, 2005   (KR) ...................... 10-2005-0017010

(51) Int. Cl.
*H01L 29/10* (2006.01)
(52) U.S. Cl. ................... 257/59; 257/72; 257/E29.147; 257/E29.151; 257/E29.273
(58) Field of Classification Search ................... 257/72, 257/E29.147, E29.151, E29.273
See application file for complete search history.

(56) References Cited

U.S. PATENT DOCUMENTS

| 6,403,409 | B1  | 6/2002 | You |
| 6,566,174 | B1* | 5/2003 | Takechi et al. ............... 438/149 |
| 6,617,203 | B2  | 9/2003 | Kim et al. |
| 6,753,235 | B2  | 6/2004 | So et al. |
| 2001/0003657 | A1  | 6/2001 | Lee |
| 2004/0160403 | A1* | 8/2004 | Tsai ........................... 345/92 |
| 2007/0035532 | A1* | 2/2007 | Amundson et al. .......... 345/204 |
| 2007/0141816 | A1* | 6/2007 | Miyairi et al. ............... 438/487 |

OTHER PUBLICATIONS

Inoue, et al., "Analysis of Degradation Phenomenon Caused by Self-Heating in Low-Temperature-Processed Polycrystalline Silicon Thin Film Transistors", *The Japan Society of Applied Physics*, 41(11A), pp. 6313-6319, (Nov. 2002).

* cited by examiner

*Primary Examiner*—Thanh V Pham
*Assistant Examiner*—Tony Tran
(74) *Attorney, Agent, or Firm*—McKenna Long & Aldridge LLP

(57) ABSTRACT

A thin film transistor including: an active layer on a substrate, the active layer having at least two unit channels; and source and drain electrodes on the active layer, wherein an interval D between each of the channels is larger than a unit channel width W.

2 Claims, 12 Drawing Sheets

METHOD FOR FABRICATING LIQUID CRYSTAL DISPLAY DEVICE

CROSS-REFERENCE TO RELATED APPLICATIONS

This application is a Divisional of application Ser. No. 11/361,990 filed Feb. 27, 2006 now U.S. Pat. No. 7,501,654; which claims priority to Korean Patent Application No. 10-2005-0017010, filed Feb. 28, 2005 all of which are hereby incorporated by reference for all purposes as if fully set forth herein.

BACKGROUND OF THE INVENTION

1. Field of the Invention

The present invention relates to a liquid crystal display (LCD) device, and more particularly, to a thin film transistor and a liquid crystal display (LCD) device having the same, to prevent the degradation of thin film transistor when maintaining a uniform width to length (W/L) ratio of the channel across the entire thin film transistor.

2. Discussion of the Related Art

The demand for various display devices has increased with the development of information society. Accordingly, many efforts have been made to research and develop various flat panel display devices such as liquid crystal displays (LCD), plasma display panels (PDP), electroluminescent displays (ELD), and vacuum fluorescent displays (VFD). Some species of flat panel display devices have already been used as displays in various equipment.

Among the various flat panel display devices, liquid crystal display (LCD) devices have been most widely used due to their advantageous characteristics including a thin profile, light weight, and low power consumption, whereby the LCD devices provide a substitute for the traditional cathode ray tube (CRT) display. In addition to mobile LCD devices such as notebook computer displays, LCD devices have been developed for computer monitors and also televisions to receive and display broadcasting signals.

Despite various technical advances in LCD technology, research in enhancing the picture quality of the LCD device has been, in some respects, lacking as compared to advances in other features and advantages of LCD devices. In order to use LCD devices in various environments as a general purpose display, such applications of LCD devices depends on whether LCD devices can implement a high quality picture, such as high resolution and high luminance with a large-sized screen, while still maintaining lightness in weight, thin profile, and low power consumption.

Generally as shown in FIG. 1, a related art LCD device includes upper and lower substrates 10 and 20 bonded to each other with a predetermined gap in between, and a liquid crystal layer (not shown) formed between the upper and lower substrates. At this time, each of the upper and lower substrates 10 and 20 includes a display area for displaying image signals, and a non-display area.

On the display area of the lower substrate 20, there are a plurality of gate lines arranged at fixed intervals, a plurality of data lines arranged substantially perpendicular to the gate lines to define pixel regions, and a plurality of pixel electrodes respectively formed in the pixel regions of a matrix defined by the gate and data lines. In addition, a plurality of thin film transistors TFT are formed at an area where the gate and data lines cross, thereby applying data signals to the respective pixel electrodes according to gate signals.

The display area of the upper substrate 10 has a color filter layer corresponding to the pixel regions of the lower substrate 20, a black matrix layer corresponding to other portions except the pixel regions, and a common electrode formed on an entire surface.

As signals are applied to the gate lines in sequence, the data signal is applied to the pixel electrode of the corresponding line, thereby displaying images.

Generally, an active matrix LCD device which is used for a large-sized and high-resolution display device includes a thin film transistor in each pixel to drive each pixel in an LCD panel and a driving circuit. The driving circuit drives the thin film transistor to control each pixel and applies driving signals to gate and data lines.

Driving circuits may be classified into two types, i.e., an external signal line driving circuit that is directly connected with the LCD panel by forming an additional direct circuit on an external substrate of the LCD panel as well as the thin film transistor for pixel driving and a thin film transistor formed at the same time as the driving circuit.

The thin film transistor formed at the same time as the driving circuit is provided in the non-display area (bezel) of the LCD device. Also, the thin film transistor formed at the same time as the driving circuit is generally formed of a polysilicon thin film transistor (poly-TFT) having a large electron mobility.

Hereinafter, a related art polysilicon thin film transistor will be described as follows.

FIGS. 2 and 3 are plan views showing heat emission paths by widths in a related art polysilicon thin film transistor.

Generally, a polysilicon thin film transistor is driven by a power of Ids×Vds. When the polysilicon thin film transistor is driven, the polysilicon thin film transistor generates heat. However, because the polysilicon thin film transistor has a low heat conductivity, the heat generated in the polysilicon thin film transistor is not easily emitted to the outside.

In a high-power area of the channel, the self-heating effect of the polysilicon thin film transistor becomes serious, thereby causing the degradation of the thin film transistor. Especially, if the channel width is large, the self-heating effect of the polysilicon thin film transistor becomes more serious.

FIG. 2 illustrates the plan view of a polysilicon thin film transistor having a small channel width, and FIG. 3 illustrates the plan view of a polysilicon thin film transistor having a large channel width.

If the self-heating effect is generated in the polysilicon thin film transistor having the small channel width shown of FIG. 2, the heat emission path is short in both X and Y directions, whereby the generated heat is emitted to the outside in a short time.

However, if the self-heating effect is generated in the polysilicon thin film transistor having the large channel width shown of FIG. 3, the heat emission path is long in the X direction. For example, in the case of the heat generated in the center of the channel, the heat emission path of the Y direction is short, and the heat emission path of the X direction is long. Accordingly, the generated heat is left inside the polysilicon thin film transistor, thereby causing the degradation of the polysilicon thin film transistor. As shown above, as the channel width increases, the possibility of degradation in the polysilicon thin film transistor increases due to the residual heat of the self-heating effect.

Hereinafter, the degradation of the polysilicon thin film transistor as a function of the W/L ratio will be explained as follows.

FIGS. 4 and 5 illustrate data showing variation of ΔVth (threshold voltage) according to an application voltage (Vgs=Vds) and a power density for various W/L ratios of the channel.

FIG. 6 illustrates data showing a power density versus the W/L ratio when the length of channel is 6 μm.

FIG. 7 illustrates data showing the reliability of the thin film transistor versus the W/L ratio of channel.

First, in FIGS. 4 and 5 when a W/L ratio of the channel 120/6, 80/6, 40/6, 20/6 and 6/6 (μm/μm), a variation of ΔVth is shown depending on a power density and an application voltage (Vgs=Vds) of the thin film transistor.

As shown in FIG. 4, if the same voltage (Vgs=Vds) is applied to each of the thin film transistors having the W/L ratios of 120/6, 80/6, 40/6, 20/6 and 6/6 (μm/μm), the value of ΔVth increases as the W/L ratio increases.

As shown in FIG. 5, if the same power is applied to each of the thin film transistors having the W/L ratios of 120/6, 80/6, 40/6, 20/6 and 6/6 (μm/μm), the value of ΔVth increases as the W/L ratio increases.

As described in the data of FIGS. 4 and 5, if the channel length is the same, the possibility of degradation increases in the thin film transistor having the large channel width (having the large W/L ratio).

In FIG. 6, as the W/L ratio increases with a value of ΔVth corresponding to 1V the power density decreases.

Based on the above data, if the channel length (L) is the same, the degradation of thin film transistor caused by the self-heating effect results even with lower power density as increasing the channel width (the large W/L ratio or the large channel area), thereby lowering the reliability.

To prevent the degradation of the thin film transistor caused by the self-heating effect of the polysilicon thin film transistor when forming the thin film transistor having a large channel width, it is advantageous to form a multi-channel type thin film transistor.

If the uniform W/L ratio is maintained for each channel in the multi-channel type thin film transistor, the W/L ratio of each channel decreases and the entire size of thin film transistor increases as the number of channels increases, and the W/L ratio of each channel increases and the entire size of thin film transistor decreases as the number of channels decreases.

When maintaining the uniform W/L ratio in the entire thin film transistor, the reliability of thin film transistor versus W/L ratio of each channel will be explained as follows.

As explained above, if the uniform W/L ratio in the entire thin film transistor is maintained, the number of channels increases as the W/L ratio of each channel decreases. For example, when the W/L ratio of each channel is the largest, a signal channel is provided in the thin film transistor. In the case when the W/L ratio of each channel is large, the interval between each of the channels decreases, so that the entire size of thin film transistor decreases.

Based on the data of FIG. 7, in the case of the thin film transistor having a large W/L ratio of each channel (that is, the entire size of thin film transistor decreases), ΔVth increases even though the same voltage (Vgs=Vds) is applied.

When the uniform W/L ratio is maintained in the entire thin film transistor, the reliability is lowered as the W/L ratio of unit channel increases.

The related art polysilicon thin film transistor has the following disadvantages.

First, the degradation of thin film transistor becomes serious due to the self-heating effect as the W/L ratio in the thin film transistor increases.

Also, when applying the same driving voltage, the reliability degrades as the W/L ratio increases.

In addition, even though the uniform W/L ratio is maintained in the thin film transistor, the W/L ratio of each channel increases and the entire size of thin film transistor decreases, thereby lowering the reliability of thin film transistor.

SUMMARY OF THE INVENTION

Accordingly, the present invention is directed to a thin film transistor and a liquid crystal display (LCD) device having the same that substantially obviates one or more of the problems due to limitations and disadvantages of the related art.

An advantage of the present invention is to provide a thin film transistor and a liquid crystal display (LCD) device having the same, to improve the reliability of thin film transistor by preventing degradation of the thin film transistor generated due to a self-heating effect.

Additional features and advantages of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the present invention, as embodied and broadly described herein, a thin film transistor including: an active layer on a substrate, the active layer having at least two unit channels; and source and drain electrodes on the active layer, wherein an interval D between each of the channels is larger than a unit channel width W.

In another aspect of the present invention, a liquid crystal device including: a liquid crystal display panel; and a liquid crystal driving device including a plurality of multi-channel thin film transistors wherein the plurality of multi-channel thin film transistors have two different W/L ratios.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the embodiment of the present invention, examples of which are illustrated in the accompanying drawings. Wherever possible, the same reference numbers will be used throughout the drawings to refer to the same or like parts.

In the LCD device according to the present invention, a multi-channel thin film transistor is formed in a non-display area (bezel) of a lower substrate.

Figure 1:
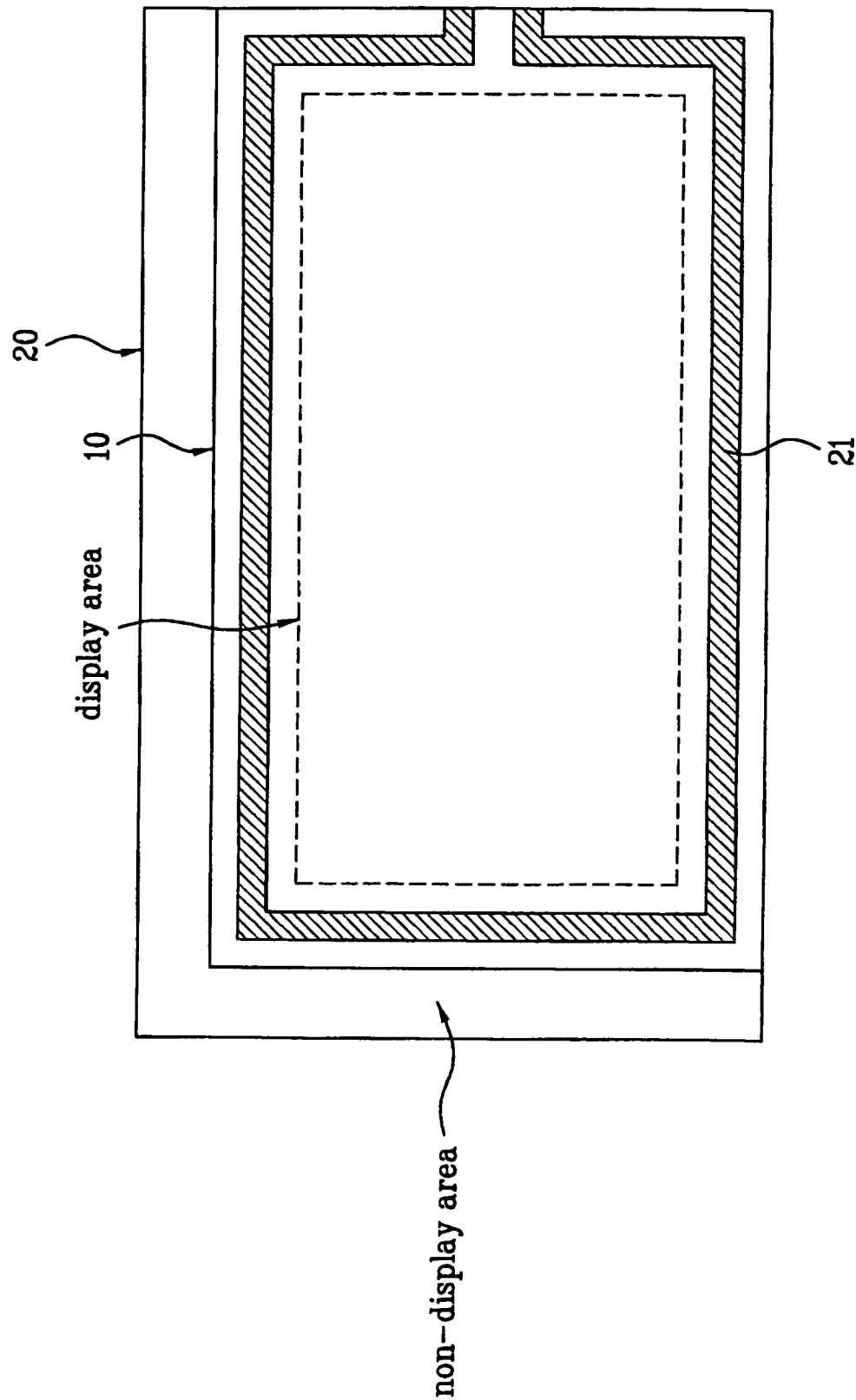
FIG. 1 illustrates a layout of upper and lower substrates of a related art LCD device.
Figure 2:
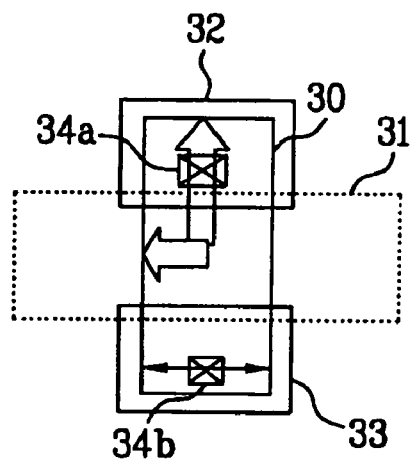
FIGS. 2 and 3 are plan views showing heat emission paths by widths in a related art polysilicon thin film transistor.
Figure 3:
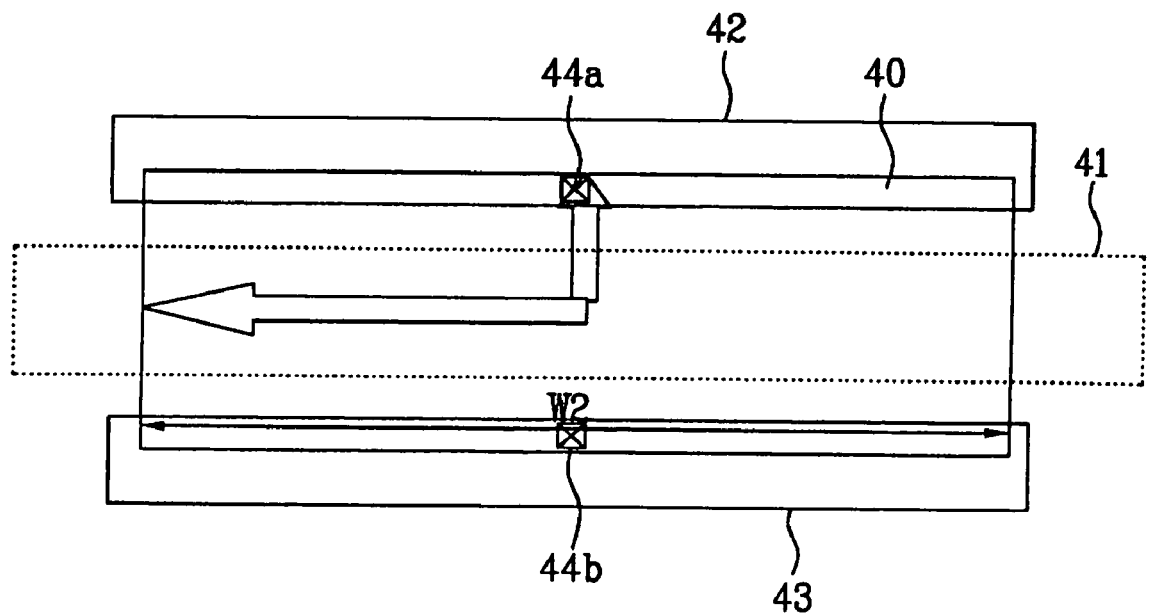
Figure 4:
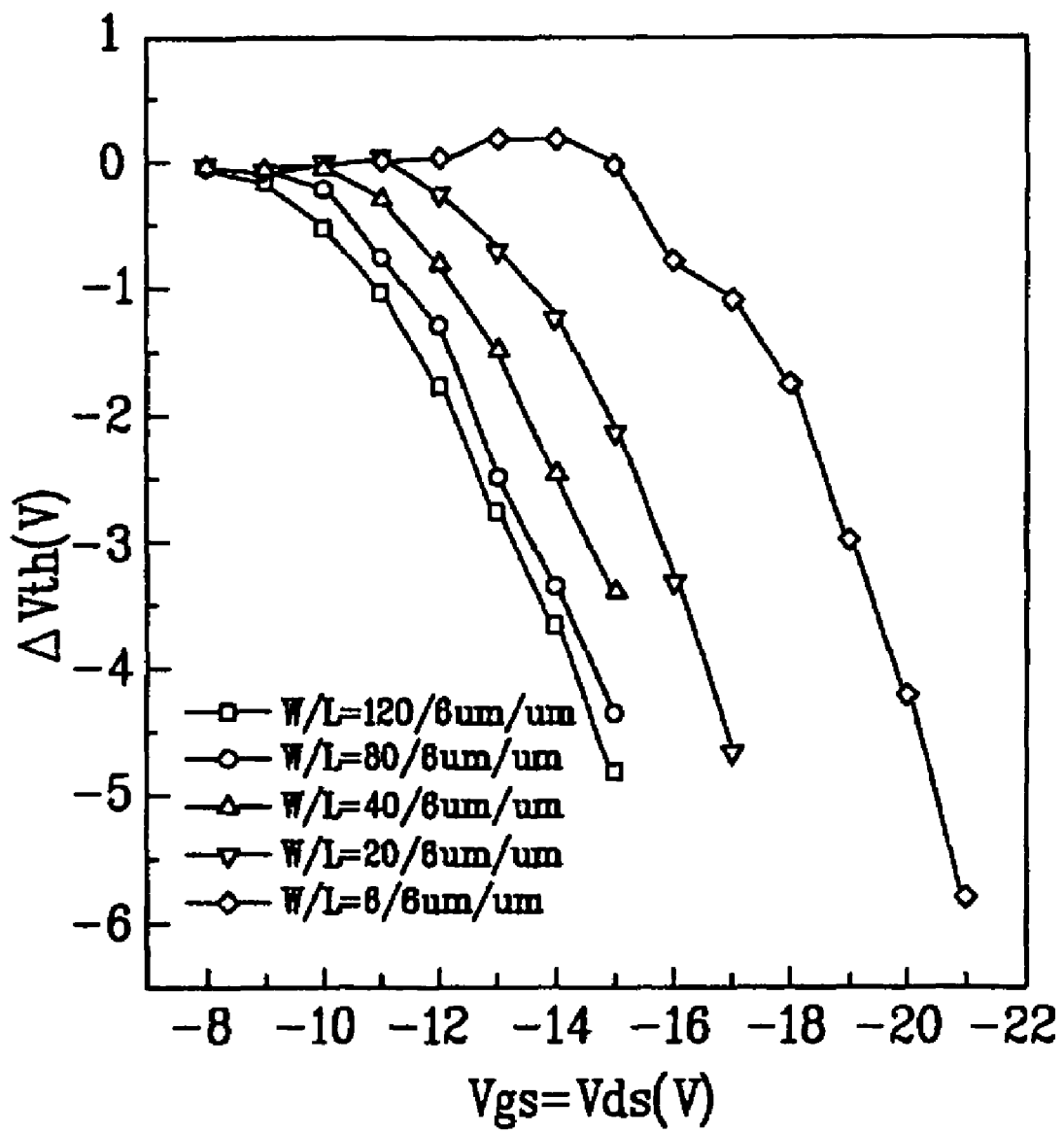
FIGS. 4 and 5 illustrate data showing the variation of ΔVth (threshold voltage) according to an application voltage (Vgs=Vds) and a power density for various W/L ratios of the channel.
Figure 5:
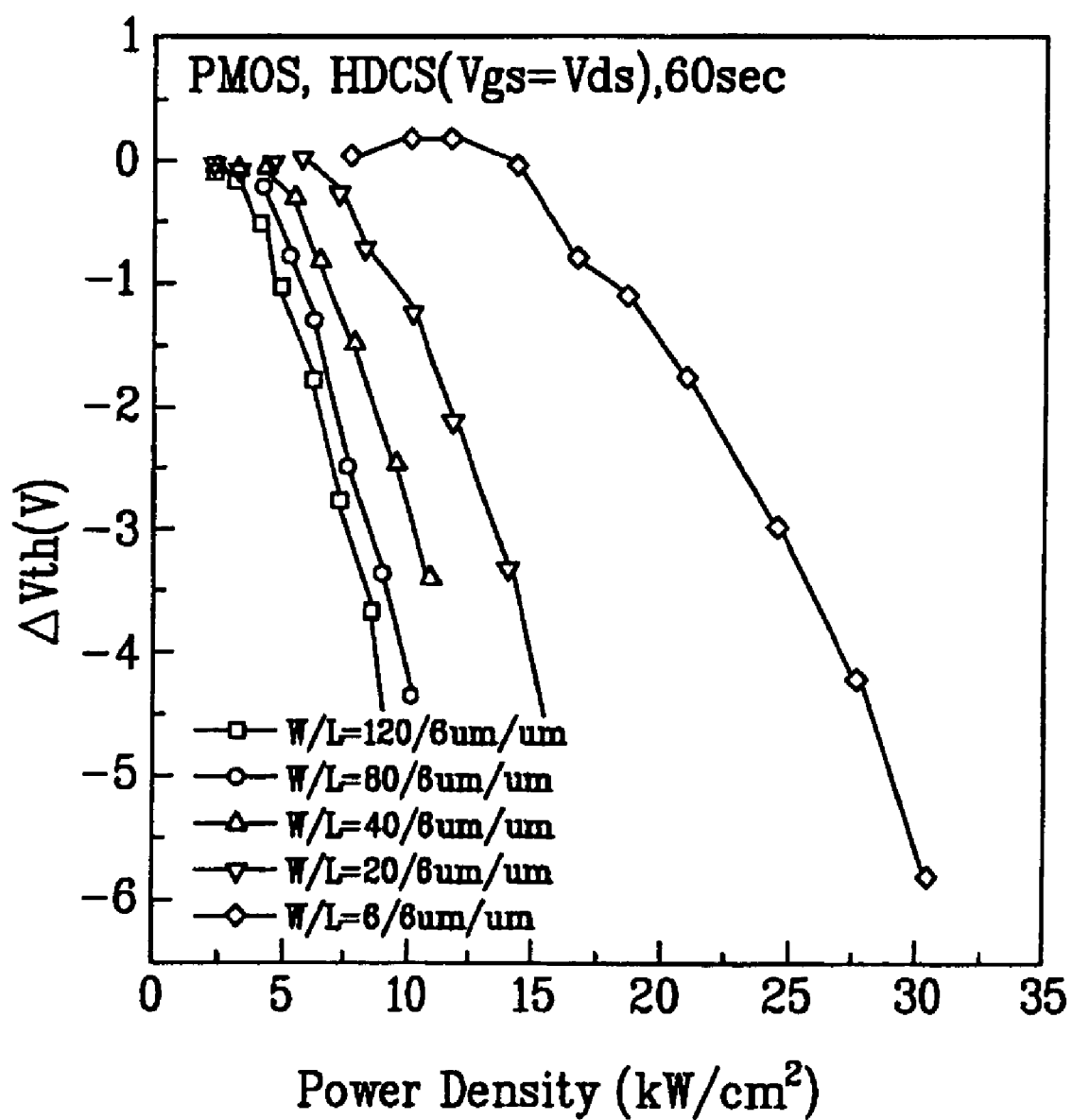
Figure 6:
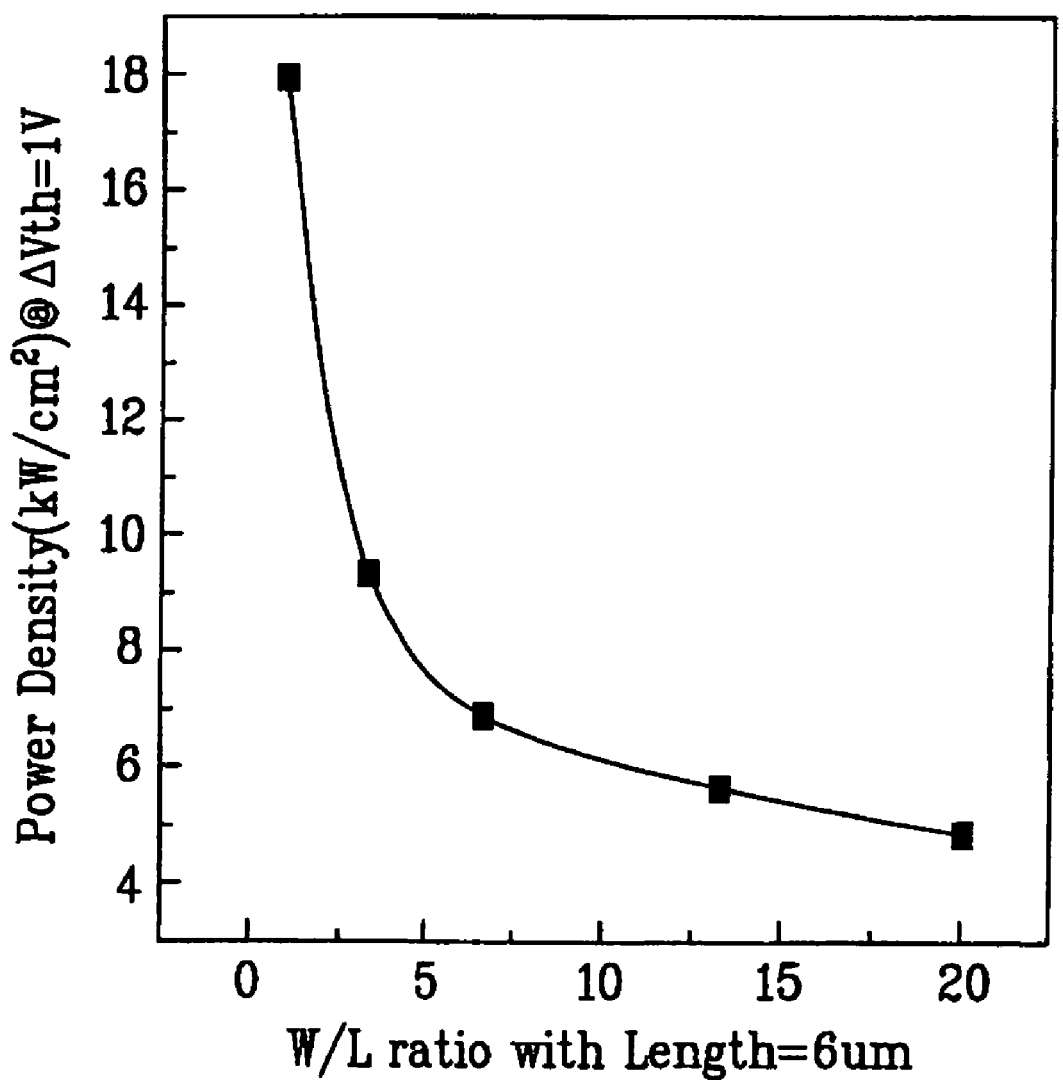
FIG. 6 illustrates data showing a power density versus the W/L ratio when the length of the channel is 6 μm.
Figure 7:
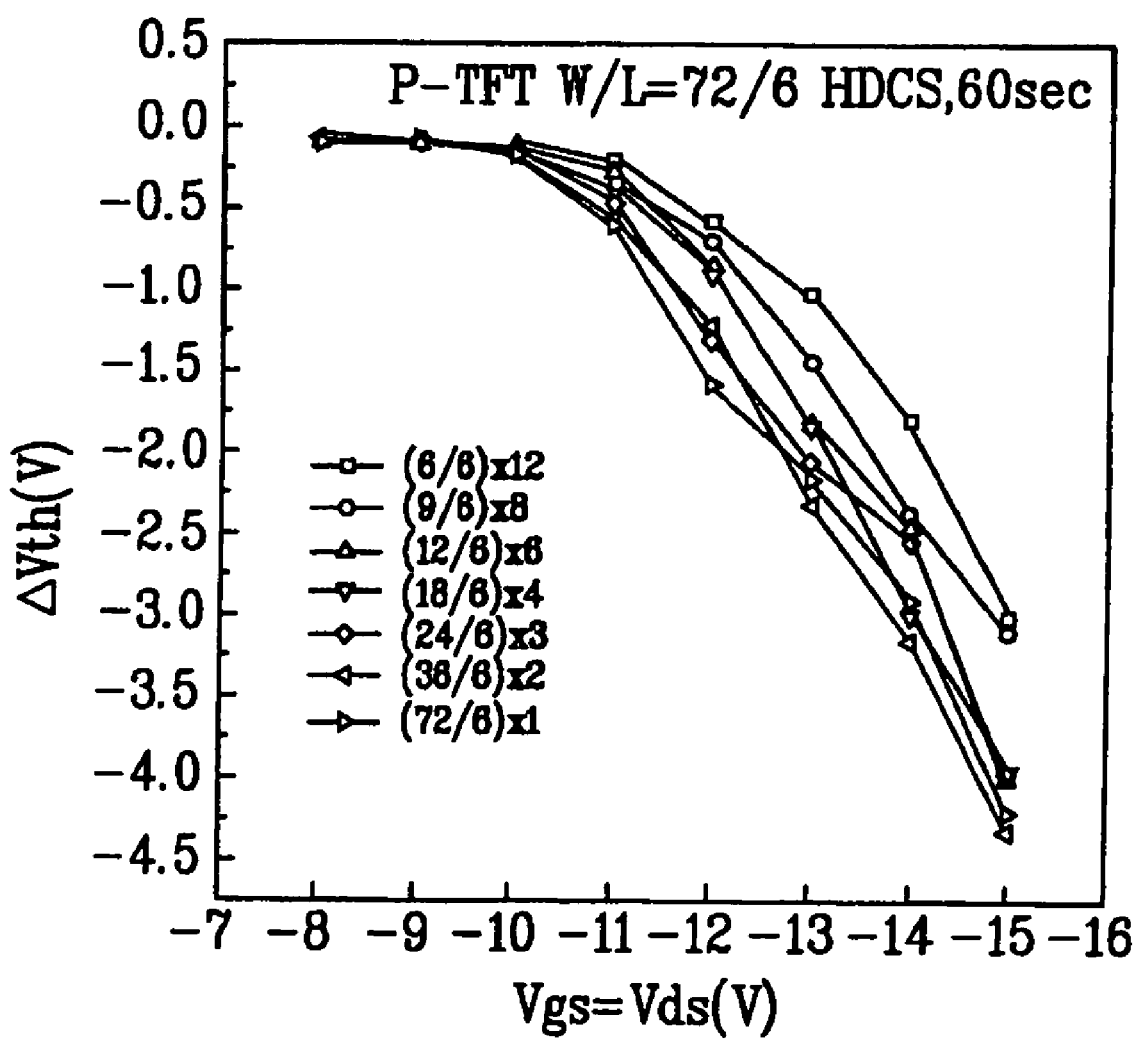
FIG. 7 illustrates data showing reliability of the thin film transistor versus the W/L ratio of the channel.
Figure 8:
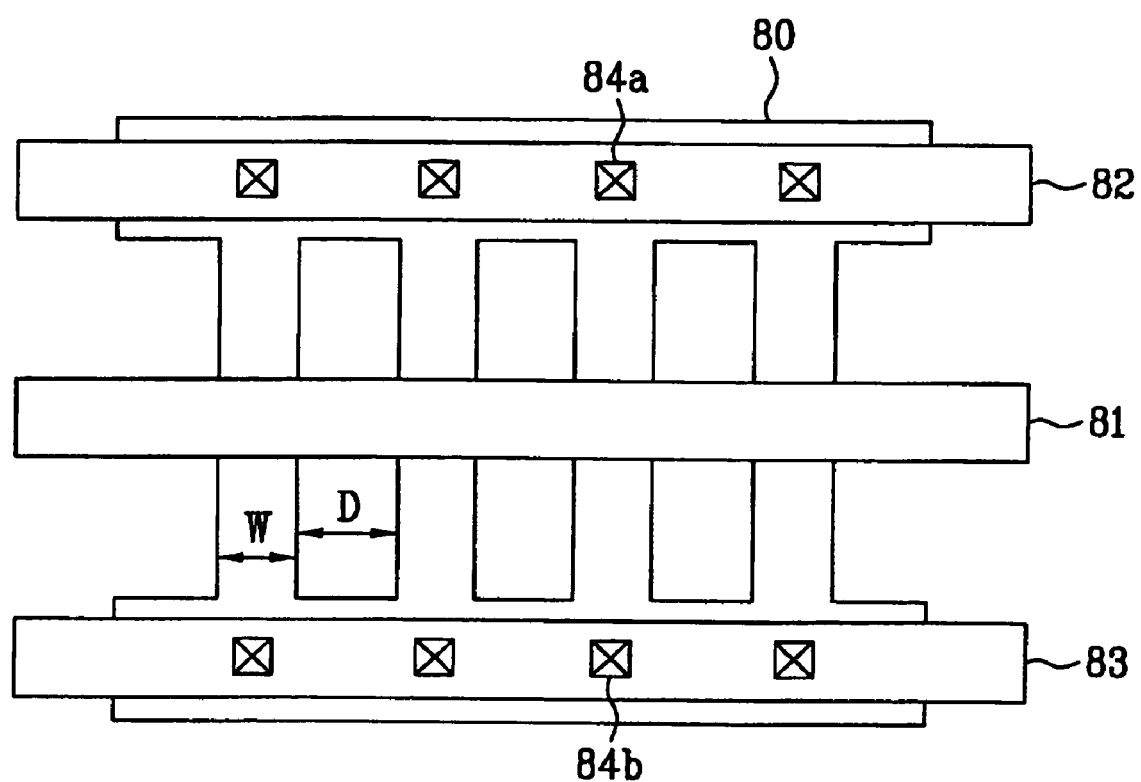
FIG. 8 illustrates a plan view of a thin film transistor having a large channel width according to the related art.
Figure 10:
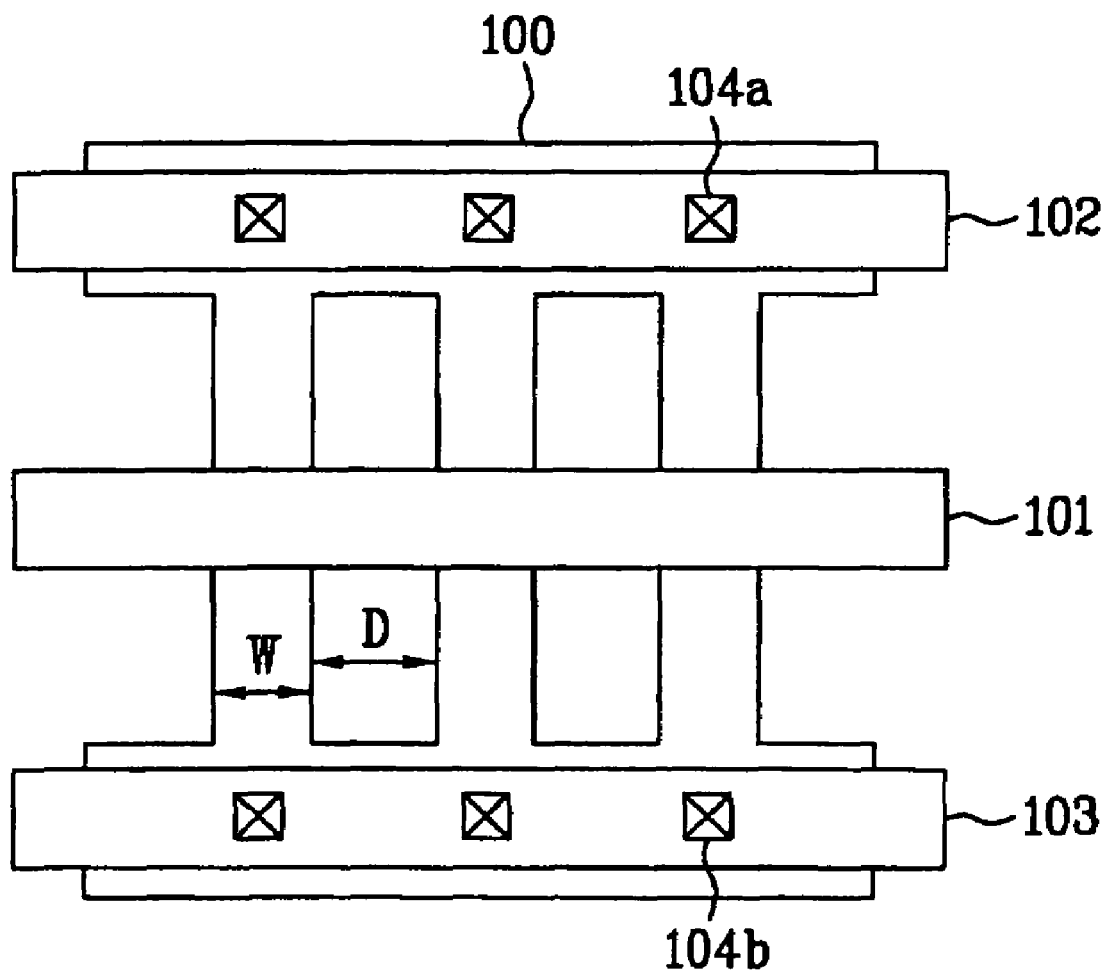
FIG. 10 illustrates a plan view of a thin film transistor having a small channel width according to the related art.

To make a comparison between the present invention and the related art, first, a related art multi-channel thin film transistor is explained as follows. As shown in FIGS. 8 and 10, the related art multi-channel thin film transistor includes of an active area 80 or 100, a gate line 81 or 101, a drain electrode 82 or 102, and a source electrode 83 or 103. At this time, the active area 80 or 100 includes first and second areas arranged in parallel at a predetermined interval, and a plurality of third areas formed at fixed intervals (D), each third area having a width of 'W' to connect the first and second areas to each other. The gate line 81 and 101 extends across the third areas of the active area. Also, the drain electrode 82 and 102 is formed in parallel above the first area, and the source electrode 83 and 103 is formed above the second area in parallel. In this state, the drain and source electrodes are connected with the active area by a plurality of contact holes 84a, 84b, 104a, and 104b. Herein, 'W' is the channel width, and 'D' is an interval between each of the channels.

The thin film transistor shown in FIG. 8 is an example of a multi-channel thin film transistor having a large W/L ratio (i.e., W/L greater than about 5) for the entire thin film transistor. Also, the thin film transistor shown in FIG. 10 is a multi-channel thin film transistor having a relatively small W/L ratio for the entire thin film transistor.

When forming the multi-channel thin film transistor, to prevent degradation of the thin film transistor caused by self-heating, there is a requirement for increasing a size of the thin film transistor having a large W/L ratio. Hereinafter, various multi-channel thin film transistors according to the preferred embodiments of the present invention will be explained as follows.

Figure 9A:
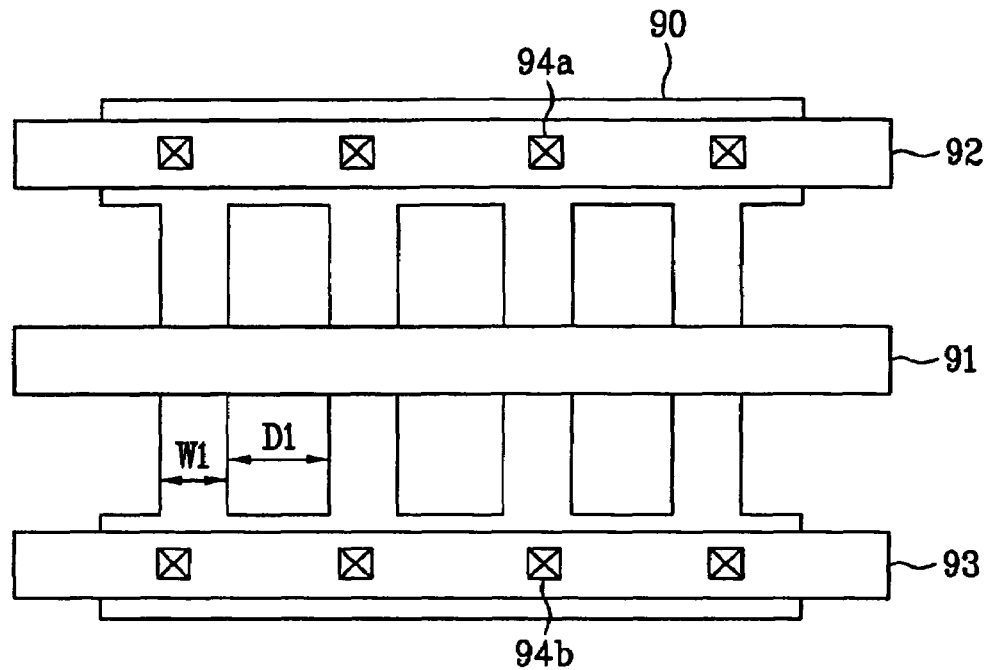
FIGS. 9A to 9C illustrate plan views of thin film transistors, each having a large channel width, according to the preferred embodiments of the present invention.
Figure 9B:
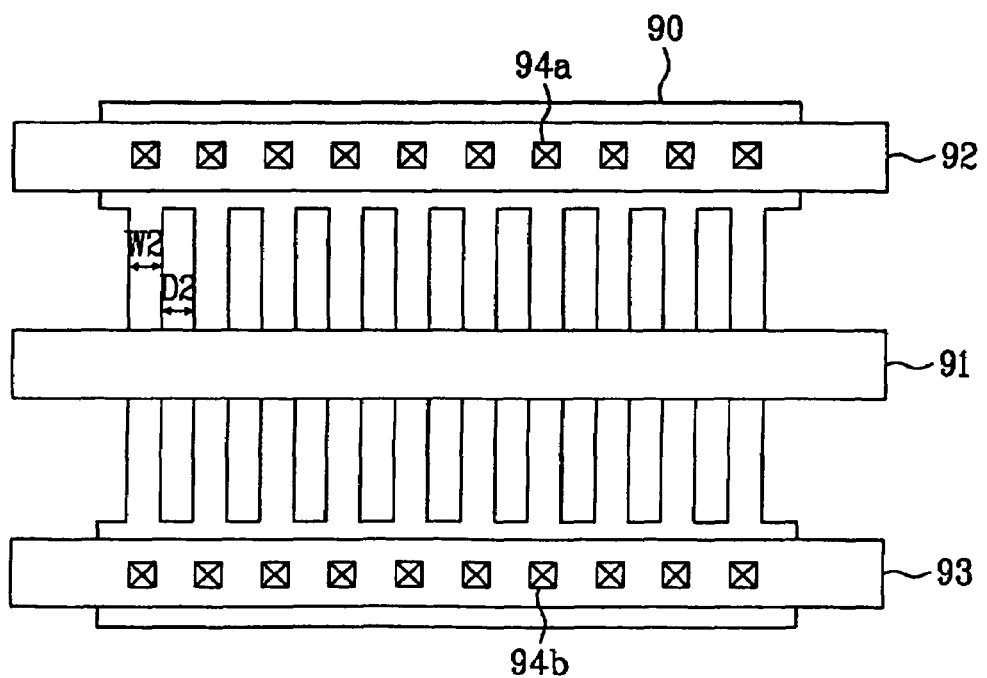
Figure 9C:
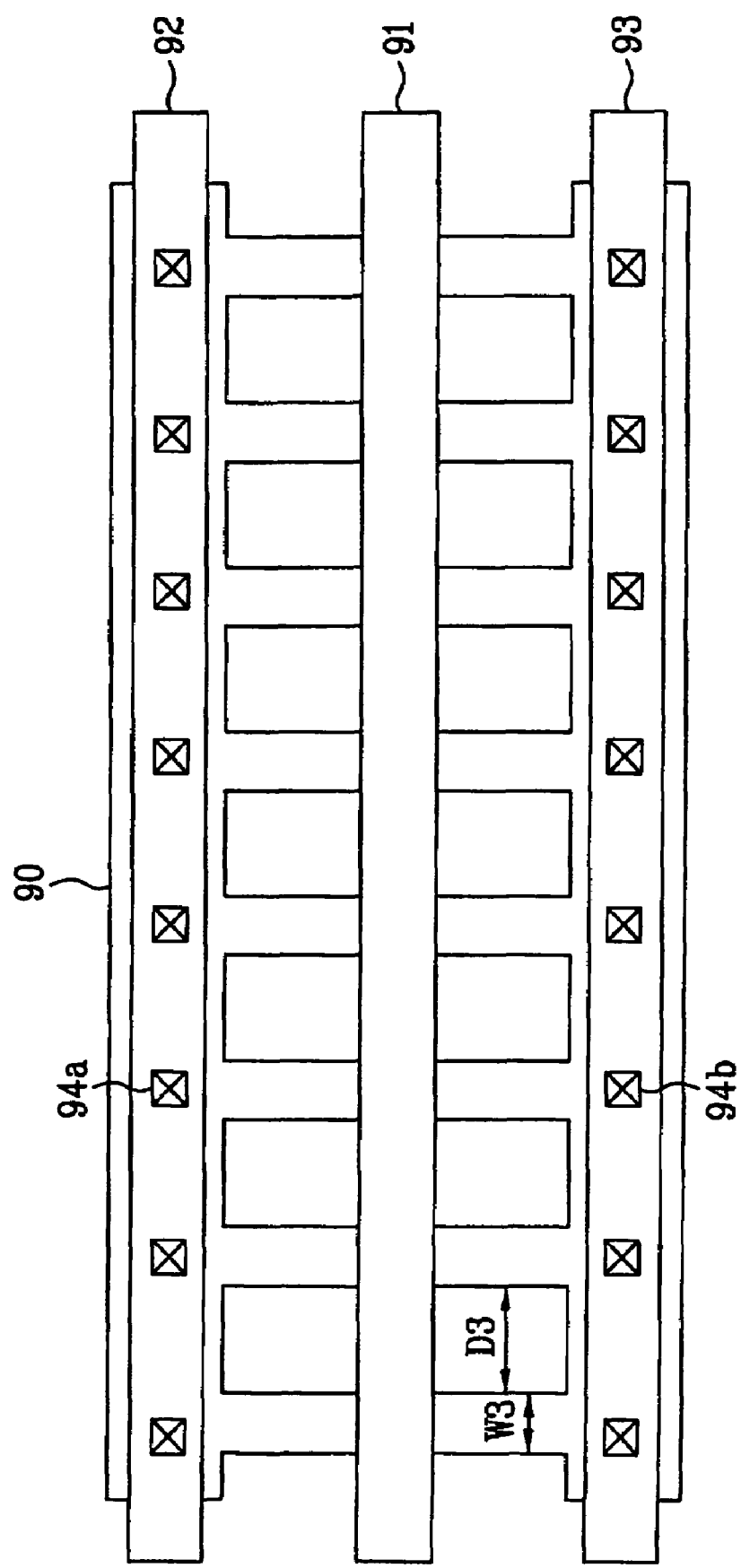

The multi-channel thin film transistors according to the preferred embodiments of the present invention, shown in FIGS. 9A to 9C, may be used in an LCD device or also may be used as single thin film transistors for preventing the degradation caused by self-heating.

First, as shown in FIG. 9A, an interval D1 between each of channels in the preferred embodiment of the present invention is larger than the interval D between each of channels in the related art, for example, $0.5\ \mu m \leq D1 \leq 500\ \mu m$. In this case, the unit channel width W1 of an active area 90 may be the same as the related art unit channel width W, for example, $0.5\ \mu m \leq W1 \leq 1000\ \mu m$. That is, even though the unit channel W/L ratio of the thin film transistor is the same, the entire size of thin film transistor increases because the interval between each of the channels is larger than the related art. Accordingly, it is possible to prevent the degradation caused by self-heating.

Secondly, as shown in FIG. 9B, a W/L ratio of the unit channel is smaller than the related art, whereby the number of channels increases. In this case, the unit channel width W2 is narrower than the related art unit channel width W, for example, $0.5\ \mu m \leq W2 \leq 500\ \mu m$. Also, the related art interval D and an interval D2 between each of channels have the following relationship: $D2 \geq (1/2) \times D$, for example, $0.5\ \mu m \leq D2 \leq 250\ \mu m$.

For example, supposing that the W/L ratio of the entire thin film transistor is the same, and the number of channels increases twice. In this case, the unit channel width W2 of the active area 90 and the related art unit channel width W have the following relationship: $W2 = (1/2) \times W$. Even when $W2 = (1/2) \times W$ and $D2 = (1/2) \times D$, the entire size of thin film transistor is increased by the extent of D2. That is, even though the W/L ratio of the entire thin film transistor is the same, the entire size of thin film transistor increases as compared with the related art because $D2 \geq (1/2) \times D$.

Thirdly, as shown in FIG. 9C, the interval between each of channels increases, and the W/L ratio of unit channel decreases. By increasing the interval between each of channels, the interval D3 shown in FIG. 9C is larger than the related art interval D, i.e., D3>D, for example, $1\ \mu m \leq D3 \leq 1000\ \mu m$. Also, by decreasing the W/L ratio of the unit channel, a unit channel width W3 shown in FIG. 9C is smaller than the related art unit channel width W, i.e., W3<W, for example, $0.25\ \mu m \leq W3 \leq 500\ \mu m$. In the case where the W/L ratio of entire thin film transistor is the same, the entire size of thin film transistor increases because $D3 \geq (1/2) \times D$. Herein, reference numbers 91, 92 and 93 respectively correspond to a gate line, a drain electrode, and a source electrode. Also, reference numbers 94a and 94b correspond to contact holes.

If the above multi-channel polysilicon thin film transistor is used in a non-display area of the LCD device, it is possible to increase the size of thin film transistor having the large W/L ratio, thereby improving the reliability of the LCD device.

The above-mentioned multi-channel thin film transistors described in FIGS. 9A to 9C may be used as the signal transistor to prevent the degradation caused by self-heating.

According to the increase in the entire size of the multi-channel thin film transistor having a large W/L ratio, the problem of an increasing circuit area is compensated the increasing entire size of multi-channel thin film transistors. Hereinafter, for the multi-channel thin film transistor having a small channel width (small W/L ratio, i.e., W/L less than about 5), the structure will be explained as follows.

Figure 11A:
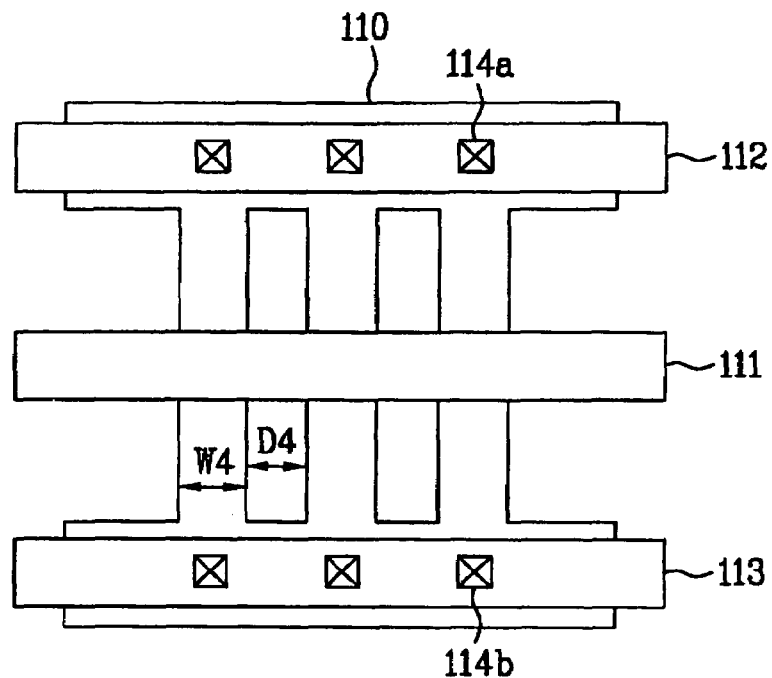
FIGS. 11A to 11C illustrate plan views of thin film transistors, each having a small channel width, according to the preferred embodiments of the present invention.

First, as shown in FIG. 11A, an interval D4 between each of channels decreases, for example, $0.25\ \mu m \leq D4 \leq 125\ \mu m$. At this time, a unit channel width W4 of an active area 110 is the same as the related art unit channel width W, for example, $0.5\ \mu m \leq W4 \leq 1000\ \mu m$. That is, even though the entire W/L ratio is the same, the entire size of the thin film transistor shown in FIG. 11A decreases as compared with the related art because the interval between each of channels shown in FIG. 11A is smaller than the related art.

Figure 11B:
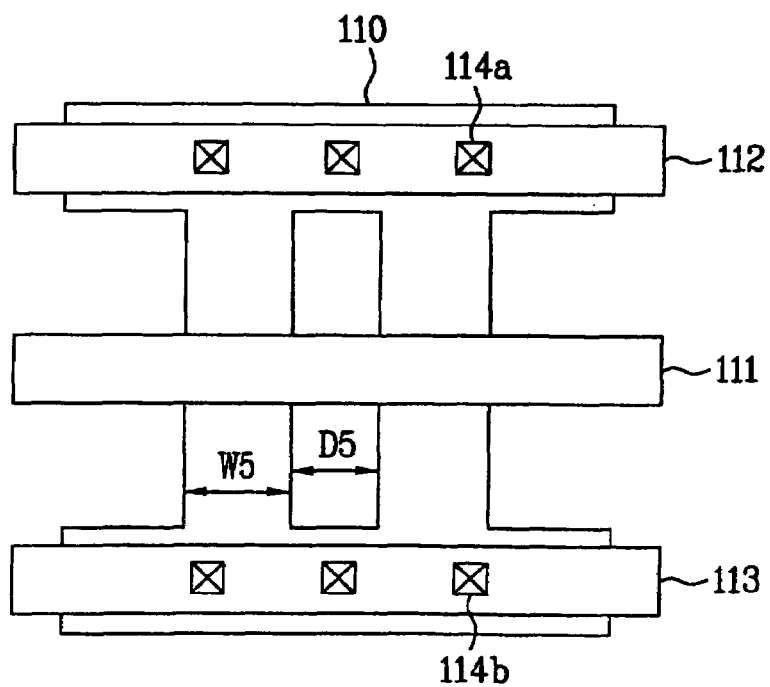

Secondly, as shown in FIG. 11B, as the W/L ratio of the unit channel increases, the number of channels decreases. In this case, a unit channel width W5 of an active area 110 is larger than the related art unit channel width W, for example, $1\ \mu m \leq W5 \leq 2000\ \mu m$. Also, an interval D5 between each of channels shown in FIG. 11B is the same as or smaller than the related art interval D between each of channels, for example, $0.25\ \mu m \leq D5 \leq 500\ \mu m$. For example, when the W/L ratio of entire thin film transistors is the same, the entire size of thin film transistor decreases as compared with the related art because D5<D.

Figure 11C:
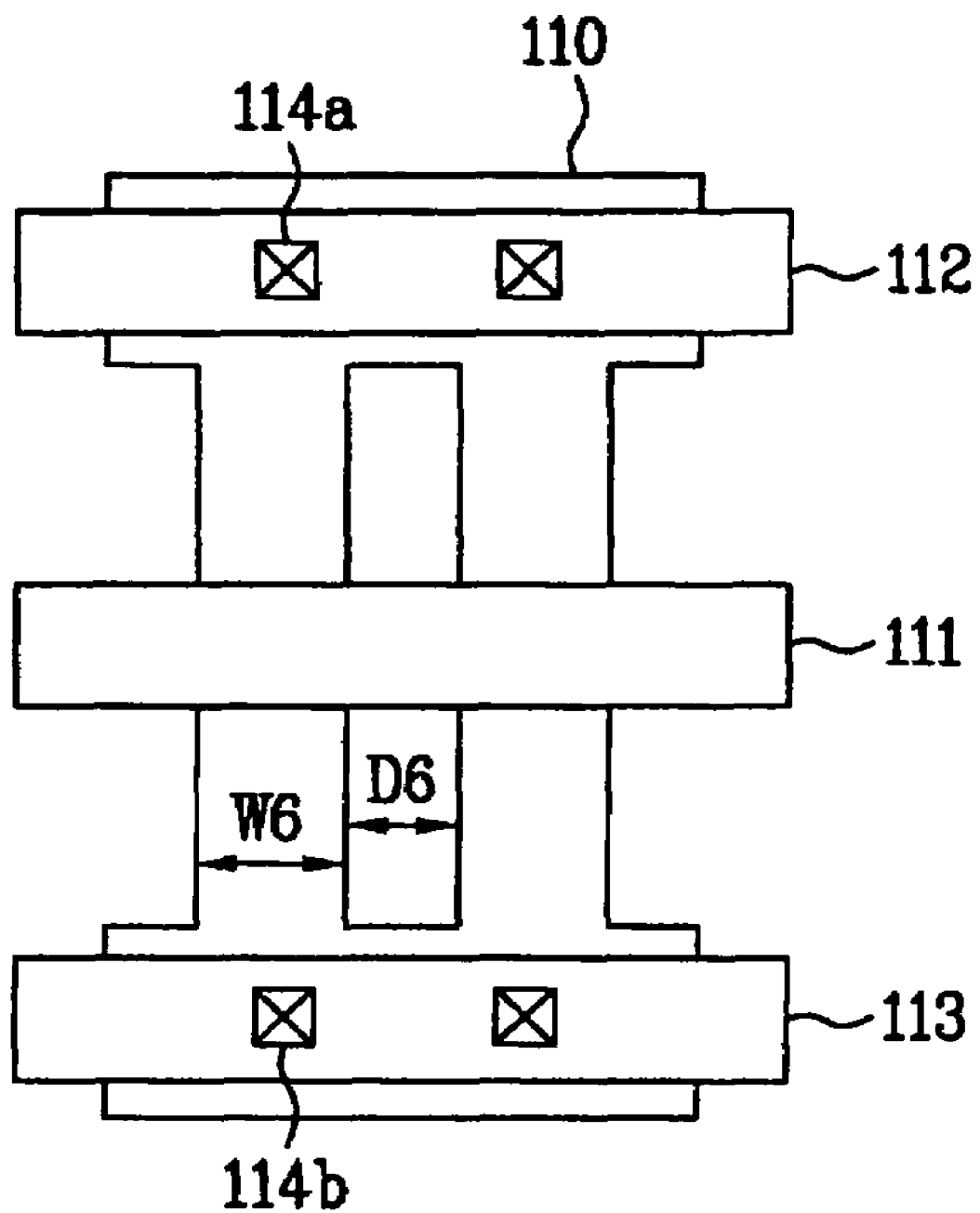

Thirdly, as shown in FIG. 11C, as the interval D6 between each of channels is smaller than the related art interval D, the W/L ratio of unit channel increases. In this case, as the interval D6 between each of channels decreases, it satisfies the following relationship: D6<D, for example, 0.25 μm≦D6≦250 μm. Also, as the W/L ratio of the unit channel increases, it satisfies the following relationship: W6>W, for example, 1 μm≦W6≦2000 μm. Herein, reference numbers 111, 112 and 113 respectively correspond to a gate line, a drain electrode, and a source electrode. In addition, reference numbers 114a and 114b correspond to contact holes.

If the LCD device according to the present invention includes a driving circuit formed of the above-mentioned multi-channel thin film transistor, the entire size of multi-channel thin film transistor having the large W/L ratio becomes larger than the related art, and the entire size of multi-channel thin film transistor having the small W/L ratio becomes smaller than the related art. For this, the thin film transistors of the three structures above mentioned can be combined as the following table 1.

| TFT having the large W/L ratio | TFT having the small W/L ratio |
| --- | --- |
| Having the large interval between each of unit channels | Having the small interval between each of unit channels |
| | Having the large W/L ratio of unit channel (decreasing the number of unit channels) |
| | Having the small interval between each of unit channels + Having the large W/L ratio of unit channel (decreasing the number of unit channels) |
| Having the small W/L ratio of unit channel (increasing the number of unit channels) | Having the small interval between each of unit channels |
| | Having the large W/L ratio of unit channel (decreasing the number of unit channels) |
| | Having the small interval between each of unit channels + Having the W/L ratio of unit channel (decreasing the number of unit channels) |
| Having the large interval between each of unit channels + Having the small W/L ratio of unit channels (increasing the number of unit channels) | Having the small interval between each of unit channels |
| | Having the large W/L ratio of unit channel (decreasing the number of unit channels) |
| | Having the small interval between each of unit channels + Having the large interval between each of unit channels (decreasing the number of unit channels) |

In the above table 1, the three exemplary structures of TFT having the large W/L ratio can be combined with the three exemplary structures of TFT having the small W/L ratio. Accordingly, the nine polysilicon thin film transistors according to the preferred embodiment of the present invention are formed in the non-display area (bezel) of the LCD device having the driving circuit.

In the above explanation, the W/L ratio of unit channel may be formed within a range of 0.5-1000. At this time, if the interval between each of unit channels corresponds to 0 μm, it is formed as the single channel.

As mentioned above, the thin film transistor according to the present invention and the LCD device having the same have the following advantages.

First, if the driving circuit of the multi-channel polysilicon thin film transistor is formed in the non-display area (bezel) of the LCD device, it is possible to increase the entire size of the thin film transistor having the large W/L ratio, thereby preventing the degradation of TFT caused by self-heating.

Also, according as the entire size of TFT having the small W/L ratio, the problem of increasing the non-display area (bezel) of the LCD device may be compensated. As a result, it is possible to improve the reliability of the LCD device.

In addition, as the entire size of the multi-channel polysilicon thin film transistors increases, the reliability of thin film transistor improves.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A liquid crystal display device, comprising:
a liquid crystal display panel; and
a liquid crystal driving device including first and second multi-channel thin film transistors wherein the first and second multi-channel thin film transistors respectively have an interval D between unit channels, a unit channel width W, and a unit channel length L, and
wherein a W/L ratio of the first multi channel thin film transistor is larger than a W/L ratio of the second multi channel thin film transistor, and
wherein an entire size of the first multi channel thin film transistors is larger than an entire size of the second multi channel thin film transistors when the first multi-channel thin film transistors have at least any one of a large interval D between each of unit channels and a small W/L ratio of the unit channel and the second multi-channel thin film transistors have at least any one of a small interval D between each of unit channels and a large W/L ratio of the unit channel,
wherein the number of the unit channel of the first multi-channel thin film transistor is more than the number of the unit channel of the second multi-channel thin film transistor.

2. A liquid crystal display device, comprising:
a liquid crystal display panel; and
a liquid crystal driving device including first and second multi-channel thin film transistors wherein the first and second multi-channel thin film transistors respectively have an interval D between unit channels, a unit channel width W, and a unit channel length L, and
wherein a W/L ratio of the first multi channel thin film transistor is larger than a W/L ratio of the second multi channel thin film transistor,
wherein an entire size of the first multi channel thin film transistors is larger than an entire size of the second multi channel thin film transistors when the first multi-channel thin film transistors have at least any one of a large interval D between each of unit channels and a small W/L ratio of the unit channel and the second multi-channel thin film transistors have at least any one of a small interval D between each of unit channels and a large W/L ratio of the unit channel, and
wherein the W/L ratio of the first multi-channel thin film transistor is larger than the W/L ratio of the second multi-channel thin film transistor and the interval between the unit channels of the first multi-channel thin film transistor is larger than the interval between the unit channels of the second multi-channel thin film transistor.

* * * * *